US008626807B2

(12) United States Patent
Boersma et al.

(10) Patent No.: US 8,626,807 B2
(45) Date of Patent: Jan. 7, 2014

(54) REUSE OF ROUNDER FOR FIXED CONVERSION OF LOG INSTRUCTIONS

(75) Inventors: Maarten Boersma, Holzgerlingen (DE); Markus Kaltenbach, Leinfelden (DE); Michael Klein, Schoenaich (DE); Silvia Melitta Mueller, Altdorf (DE); Jochen Preiss, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 1349 days.

(21) Appl. No.: 12/350,680

(22) Filed: Jan. 8, 2009

(65) Prior Publication Data
US 2010/0174764 A1 Jul. 8, 2010

(51) Int. Cl.
*G06F 7/00* (2006.01)

(52) U.S. Cl.
USPC .......................................................... 708/205

(58) Field of Classification Search
None
See application file for complete search history.

(56) References Cited

U.S. PATENT DOCUMENTS

| 5,696,709 | A | * | 12/1997 | Smith, Sr. ...................... 708/551 |
| 6,058,410 | A | * | 5/2000 | Sharangpani ................ 708/551 |
| 6,523,050 | B1 | * | 2/2003 | Dhablania et al. ............ 708/204 |
| 2007/0038693 | A1 | * | 2/2007 | Jacobi et al. .................. 708/446 |

OTHER PUBLICATIONS

Lang, T.; Bruguera, J.D.; , "Floating-point multiply-add-fused with reduced latency," Computers, IEEE Transactions on , vol. 53, No. 8, pp. 988-1003, Aug. 2004.*

"PowerPC Microprocessor Family: Vector/SIMD Multimedia Extension Technology Programming Environments Manual Version 2.06" on pp. 174-175, IBM International Business Machines Corporation 1998, 2003, 2004, 2005.
Martin S. Schmookler, et al., "A Low-power, High-speed Implementation of a PowerPCTM Microprocessor Vector Extension".
Oklobdzija, Vojin G. et al., "High-performance Energy-efficient Microprocessor Design", Chapter 8—Binary floating-point unit design: the fused multiply-add dataflow Eric Schwarz.
L. Eisen, et al., "IBM POWER6 accelerators: VMX and DFU", IBM J. Res. & Dev. Vol. 51 No. 6 Nov. 2007.
E. Hokenek, et al., Leading-zero anticipator (LZA) in the IBM RISC System/6000 floating-point execution unit, IBM J. Res. Develop. vol. 34, No. 1, Jan. 1990.

* cited by examiner

*Primary Examiner* — Idriss N Alrobaye
*Assistant Examiner* — Dayton Lewis-Taylor
(74) *Attorney, Agent, or Firm* — Cantor Colburn LLP; Randall Bluestone (57) ABSTRACT

A method for converting a signed fixed point number into a floating point number that includes reading an input number corresponding to a signed fixed point number to be converted, determining whether the input number is less than zero, setting a sign bit based upon whether the input number is less than zero or greater than or equal to zero, computing a first intermediate result by exclusive-ORing the input number with the sign bit, computing leading zeros of the first intermediate result, padding the first intermediate result based upon the sign bit, computing a second intermediate result by shifting the padded first intermediate result to the left by the leading zeros, computing an exponent portion and a fraction portion, conditionally incrementing the fraction portion based on the sign bit, correcting the exponent portion and the fraction portion if the incremented fraction portion overflows, and returning the floating point number.

17 Claims, 5 Drawing Sheets

REUSE OF ROUNDER FOR FIXED CONVERSION OF LOG INSTRUCTIONS

STATEMENT OF GOVERNMENT INTEREST

This invention was made with Government support under Contract No. HR0011-07-9-0002 awarded by DARPA. The Government has certain rights in this invention.

BACKGROUND

The present invention relates to floating point units (FPUs), and more specifically, to the reuse of the normalizer and rounder of the FPU for conversion from a fixed point format to a floating point data format which enables the execution of the log estimate in a single loop through a fused-multiply-add (FMA) data path and thereby improves the latency of log estimate instructions executed on the FPU within the FMA data path.

Figure 1:
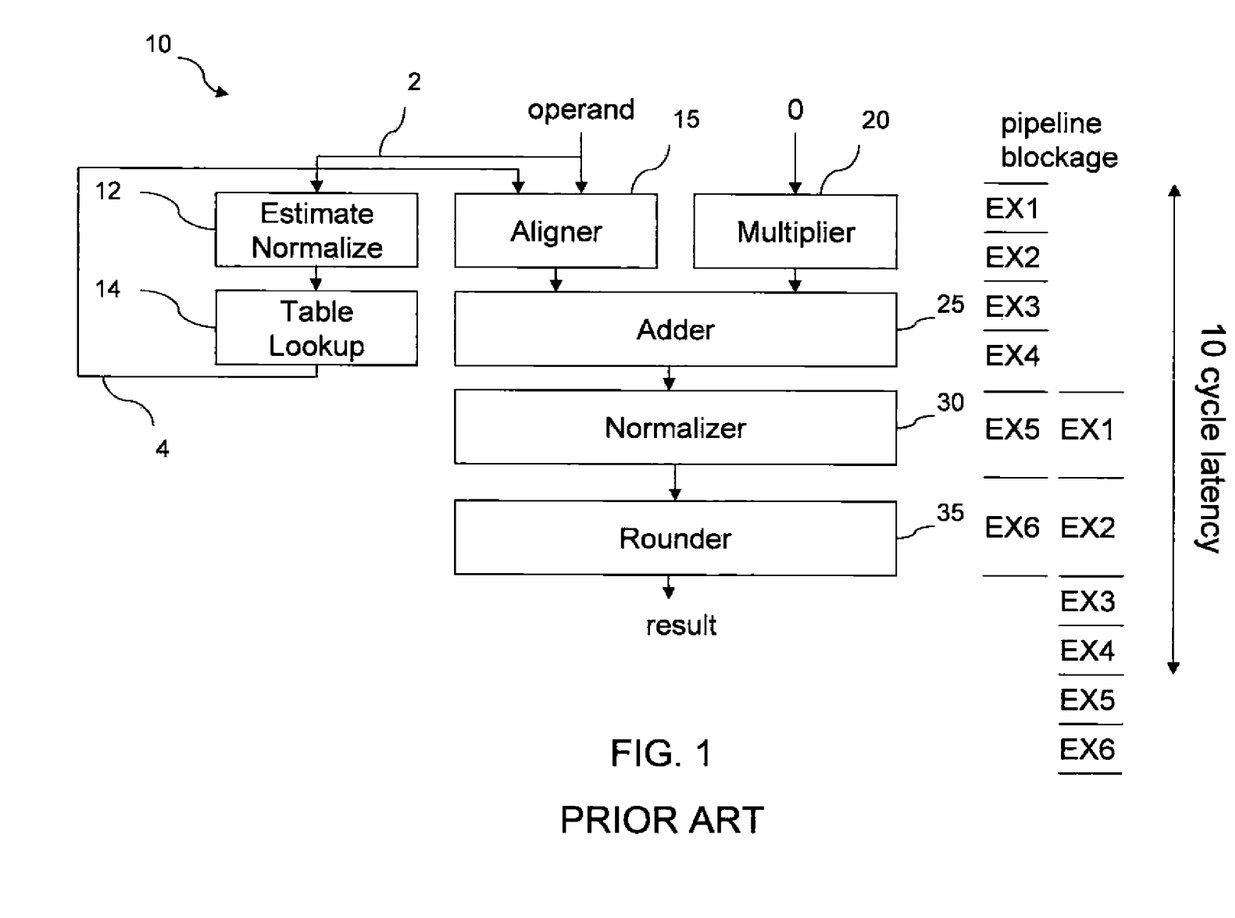
FIG. 1 is diagram illustrating a conventional FMA dataflow executing a log estimate instruction.
Figure 2:
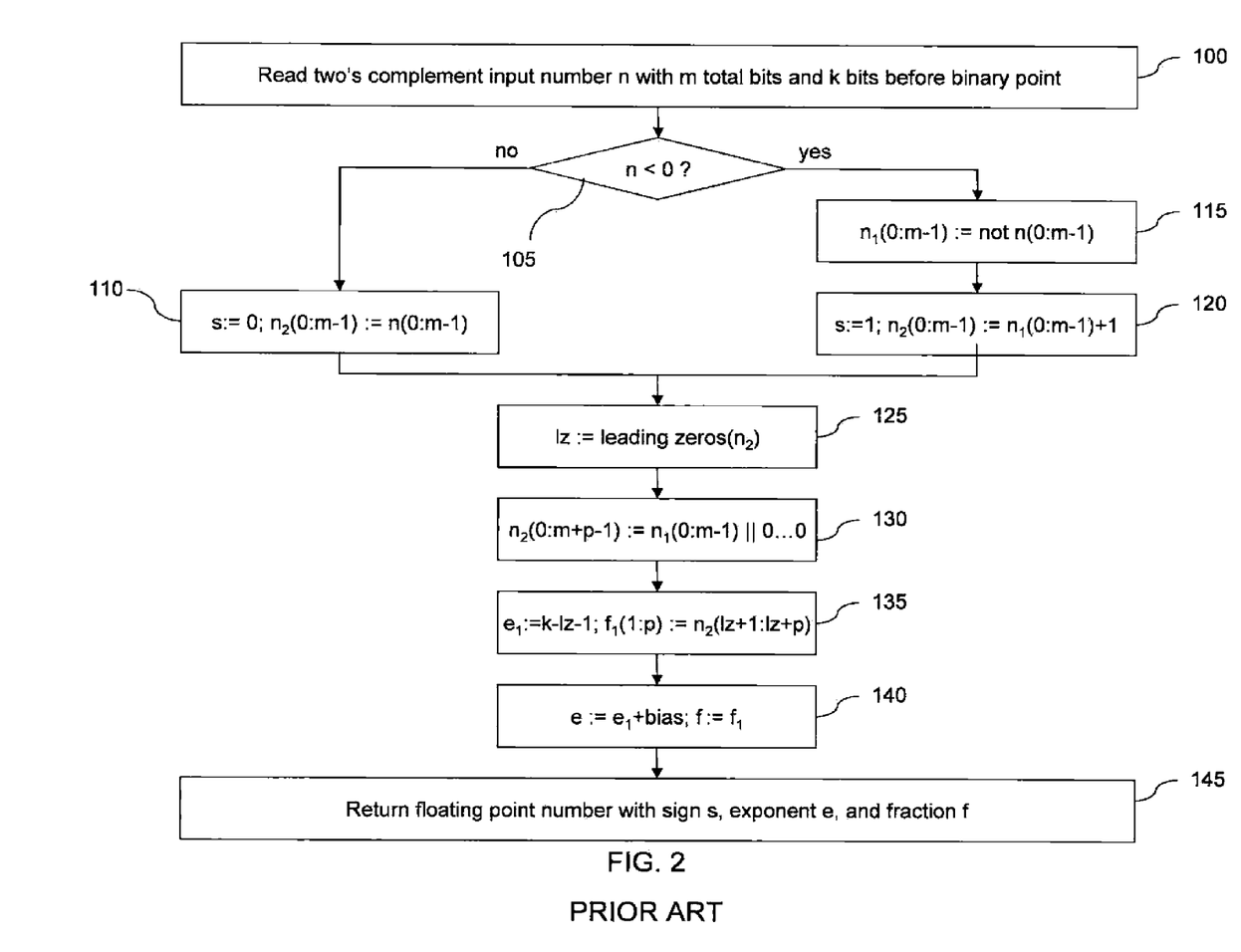
FIG. 2 is a flowchart illustrating a conversion operation for converting a fixed point number into a floating point number according to the conventional art.

FIG. 1 illustrates a dataflow of a conventional floating point unit 10. The FPU 10 includes an aligner 15, a multiplier 20, an adder 25, a normalizer 30 and a rounder 35. As shown in FIG. 1, the data flow is designed to loop twice through the FPU data path in order to execute log estimate instructions. As shown, the first loop, as indicated by reference numeral 2, computes the estimate and the second loop, as indicated by reference numeral 4, converts the estimate into a floating point data format. Specifically, an input operand is normalized to a number $x=2^{e'}*1.f$ at the estimate normalize block 12. Then, an estimate is computed for $f_L=\log(1.f)$ using a table lookup 14, for example. The table lookup 14 returns the log estimate as a two's complement fixed point number $e'.f_L$ for conversion to a floating point number. A conventional algorithm for converting from the fixed format to the floating point format is shown in FIG. 2. As shown in FIG. 2, the two's complement input number n having m total bits and k bits before the binary point is read at operation 100. From operation 100, the process moves to operation 105, where, in the aligner 15 (depicted in FIG. 1), it is determined whether the input number n is less than zero. If it is determined at operation 105 that the input number n is greater than or equal to zero (i.e., a non-negative number), then the sign bit is set to zero, and if it is determined that the input number n is less than zero (i.e., a negative number) then the input number is inverted at operation 115. From operation 115, the process moves to operation 120, where the sign bit is set to one and the input number is incremented by adding '1' to the least significant bit (LSB) via the adder 25 (depicted in FIG. 1). From operations 110 and 120, the process moves to operation 125 where leading zeros ("lz") are counted via the adder 25 which includes a leading zero anticipator (LZA).

At operation 130, the output of the adder 25 is padded with zeros. Then at operation 135, in the normalizer 30 (depicted in FIG. 1), the result is shifted to the left by the number of leading zeros counted. From operation 135, the process moves to operation 140, where in the rounder 35 (depicted in FIG. 1), the exponent and fraction are calculated and the floating point number including the sign bit, the exponent, and the fraction is returned at operation 145. There are several disadvantages regarding the conventional data flow 10. For example, the implementation of log estimate instructions in the conventional data flow 10 reuses the entire data flow for converting from a fixed format to a floating point format. Therefore, resulting in a 10-cycle latency as shown in FIG. 1.

SUMMARY

According to an embodiment of the present invention, methods for converting a signed fixed point number into a floating point number and computer program product for performing the method are provided. The methods utilize the normalizer and the rounder unit in the FPU.

According to one embodiment, a method for converting a signed fixed point number into a floating point number is provided. The method includes reading an input number corresponding to a signed fixed point number to be converted into a floating point number, determining whether the input number is less than zero, setting a sign bit based upon whether the input number is less than zero or greater than or equal to zero, computing a first intermediate result by exclusive-ORing the input number with the sign bit, computing a number of leading zeros of the first intermediate result, padding the first intermediate result with ones or zeros based upon the sign bit, computing a second intermediate result by shifting the padded first intermediate result to the left by a number based on the number of leading zeros, computing an exponent portion using the number of leading zeros, computing a fraction portion using the second intermediate result, conditionally incrementing the fraction portion based on the sign bit, correcting the exponent portion and the fraction portion if the incremented fraction portion overflows, and returning, the floating point number including the sign bit, and the exponent portion and fraction portion.

According to another embodiment of the present invention, a computer program product comprising a computer useable medium including a computer readable program, wherein the computer readable program when executed on a computer causes the computer to implement a method for converting a signed fixed point number into a floating point number is provided. The method includes reading an input number corresponding to a signed fixed point number to be converted into a floating point number, determining whether the input number is less than zero, setting a sign bit based upon whether the input number is less than zero or greater than or equal to zero, computing a first intermediate result by exclusive-ORing the input number with the sign bit, computing a number of leading zeros of the first intermediate result, padding the first intermediate result with ones or zeros based upon the sign bit, computing a second intermediate result by shifting the padded first intermediate result to the left by a number based on the number of leading zeros, computing an exponent portion using the number of leading zeros, computing a fraction portion using the second intermediate result, conditionally incrementing the fraction portion based on the sign bit, correcting the exponent portion and the fraction portion if the incremented fraction portion overflows, and returning, the floating point number including the sign bit, and the exponent portion and fraction portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 3:
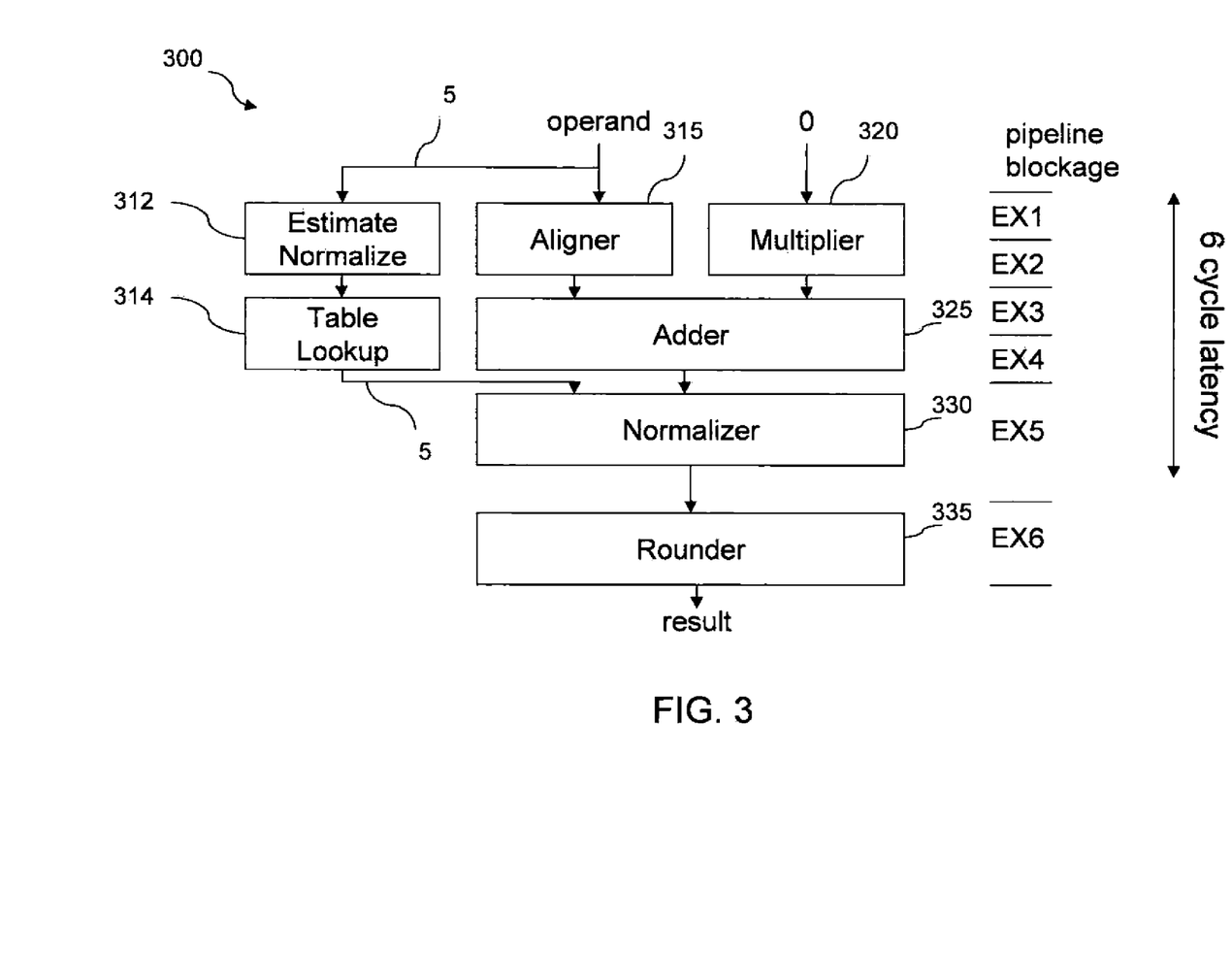
FIG. 3 is a diagram illustrating an FMA dataflow executing a log estimate instruction that can be implemented within embodiments of the present invention.

With reference now to FIG. 3, there is a floating point unit (FPU) 300 of a processor according to an embodiment of the present invention. The dataflow of the FPU 300 may operate according to a fused multiply-add (FMA) data flow, for example, where ("R=C+A*B"), where "A" is the multiplicand, "B" is the multiplier, "C" is the addend, and "R" is the result. The dataflow includes an aligner 315, a multiplier 320, an adder 325, a normalizer 330 and a rounder 335. In the dataflow, the addend is aligned by the aligner 315 prior to being combined with the product of the multiplier 320 at the adder 325. The result of the adder 325 is normalized via the normalizer 330 and the normalized result is then rounded into the instruction specific format via the rounder 335.

According to an embodiment of the present invention, a system for converting a signed fixed point number into a floating point number within the FPU 300 of a processor is provided. The system includes a preparation circuit, the normalizer 330 and the rounder 335. The preparation circuit reads an input number corresponding to a signed fixed point number to be converted into a floating point number. An estimate normalize block 312 and a table lookup 314 are also provided. The preparation circuit may be included in the table lookup 314. The standard data flow for log estimate instructions includes normalizing the input operand, if necessary at block 312, and computing a log estimate using the table lookup 314, along a single loop indicated by reference numeral 5. The loop 5 then continues to the normalizer 330 and the rounder 335 for performance of the conversion from a fixed format to a floating point format as discussed below with reference to FIG. 4. Therefore, the result is a 6-cycle latency.

According to embodiments of the present invention, a floating point number format includes a single sign bit "s", an exponent "e" that includes multiple bits, and a significand that includes a single integer bit "i" and a fraction part "f" that includes multiple bits. All the bits within the floating point number are binary integer value bits (i.e., either a binary logic "0" or "1"). The value for the floating point number is $(-1)^2 * 2^e * i.f$, normalizing converts this number to the unique number with sign bit s, exponent e', fraction f', and an integer bit with value "1". The log function is defined as $\log(2^{e'} * 1.f) = \log(2^{e'}) + \log(1.f) = e' + \log(1.f)$. The number $e + \log(1.f)$ is called the intermediate significand with integer part e' and fraction part $\log(1.f)$.

Figure 4:
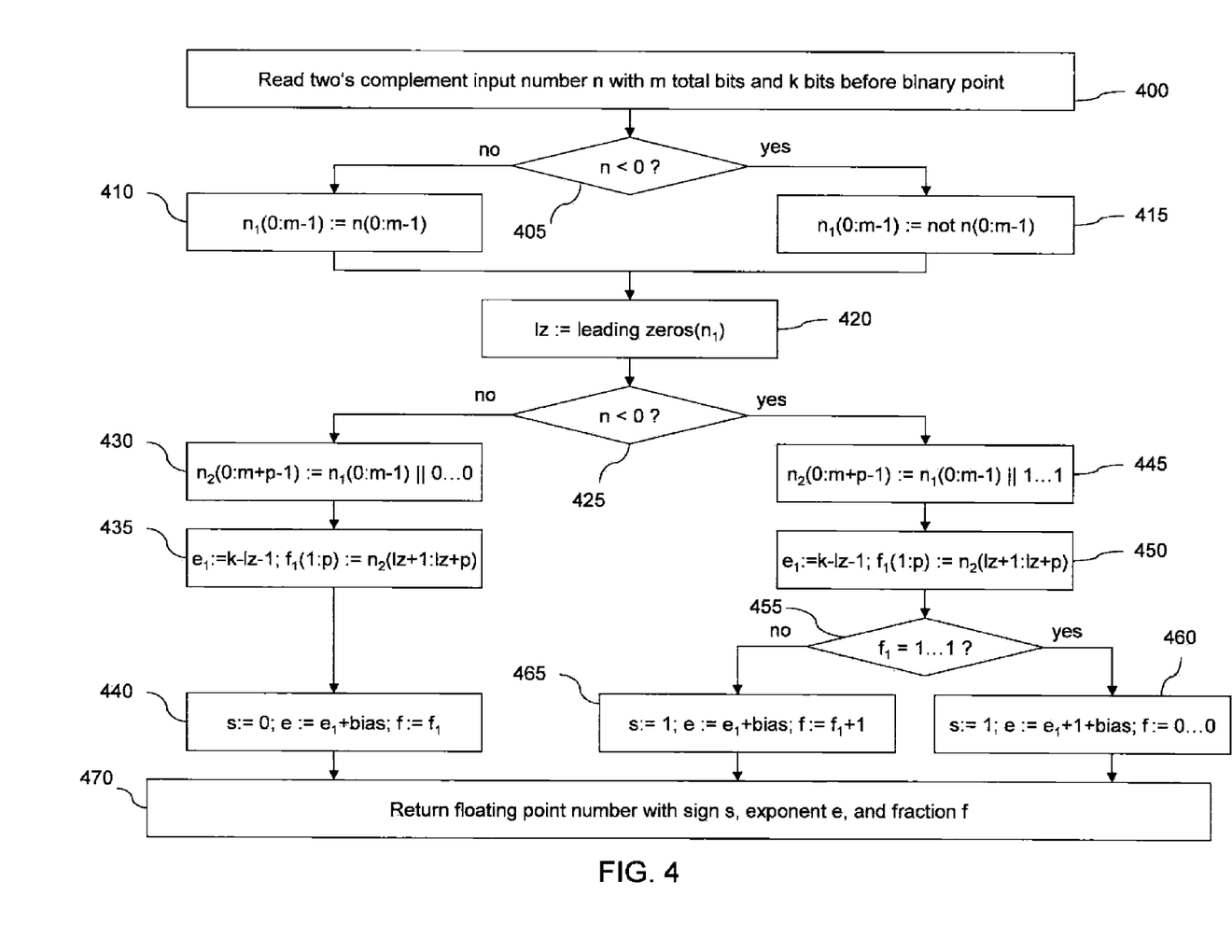
FIG. 4 is a flowchart illustrating a conversion operation for converting a fixed point number into a floating point number that can be implemented within embodiments of the present invention.

FIG. 4 is a flowchart illustrating the conversion of a fixed point number into a floating point number that can be implemented within embodiments of the present invention. FIG. 4 will now be described with reference to the data flow shown in FIG. 3. At operation 400, the two's complement input number "n" having "m" total bits and "k" bits prior to the binary point is read. At operation 405, it is determined whether the input number n is less than zero or greater than or equal to zero. If it is determined that the input number n is greater than or equal to zero (i.e., a non-negative number), then the input number n remains the same at operation 410, and if it is determined in operation 405, that the input number n is less than zero (i.e., a negative number), then the process moves to operation 415 where the input number n is inverted. From operations 410 and 415 respectively, the process moves to operation 420, where leading zeros ("lz") are counted. According to an embodiment of the present invention, operations 400 through 420 are performed via the table lookup 314 (depicted in FIG. 3). The leading zeros may be counted in a manner as disclosed in application Ser. No. 12/208,439 entitled "NORMALIZER SHIFT PREDICTION FOR LOG ESTIMATE INSTRUCTIONS" filed on Sep. 11, 2008 by Maarten J. Boersma et al., the disclosure of which is incorporated herein by reference in its entirety.

From operation 420, the process moves to operation 425 where it is determined whether the input number n is less than zero or greater than or equal to zero. If it is determined that the input number n is greater than or equal to zero, the process moves to operation 430 where the result of the table lookup 314 ("$n_1$") (i.e., a first intermediate result) is padded with zeros on a least significant bit side. From operation 430, the process moves to operation 435 where a second intermediate result is computed by normalizing the first intermediate result by shifting the results ("$n_2$") (i.e., the padded first intermediate result) to the left by a number equal to the number of leading zeros counted. According to an embodiment of the present invention, operations 425 through 435 are performed via the normalizer 330 of the floating-point fused multiply-add computation (depicted in FIG. 3). Further shown in FIG. 4, "p" represents the number of fraction bits and "bias" denotes the exponent bias of the precision of the floating point number.

From operation 435, the process moves to operation 440 where the sign bit s is set to zero and the exponent e and the fraction part f are computed and from operation 440, the process moves to operation 470 where the floating point number including the sign bit s, exponent e and the fraction f are returned. According to an embodiment of the present invention, operations 440 and 470 are performed in the rounder 335 of the floating-point fused multiply-add computation (depicted in FIG. 3).

If it is determined at operation 425, that n is less than zero, the process moves to operation 445 where the result of the table lookup ("$n_1$") (i.e., the first intermediate result) is padded with ones on a least significant bit side. From operation 445, the process moves to operation 450, where the result ("$n_2$") (i.e. the padded first intermediate result) is then shifted to the left by a number equal to the number of leading zeros counted. According to an embodiment of the present invention, operations 445 and 450 are performed at the normalizer 330.

From operation 450, the process moves to operation 455 where it is determined whether the fraction f is equal to all ones. If it is determined that the fraction f is not equal to all ones, the process moves to operation 465 where the sign bit is set to one, the exponent e is computed and the fraction f is incremented by adding a "1" to the LSB. On the other hand, if it is determined in operation 455 that the fraction f is equal to all ones, then the process moves to operation 460 where the sign bit s is set to one and the exponent e and the fraction f are corrected by incrementing the exponent e and setting the fraction f to all zeros. As can be seen in FIG. 4, according to an embodiment of the present invention, the fraction f is conditionally incremented based on the sign bit. That is, the fraction f is incremented if the sign bit is set to one (operation 465) and the fraction is not incremented if the sign bit is set to zero (operation 440). From operation 460, the process moves to operation 470 where the floating point number including the sign bit s, exponent e and the fraction f is returned. According to an embodiment of the present invention, operations 455 through 470 are performed in the rounder 335.

The following is an example of a conversion from a fixed format to a floating point format. In the following example, the input number is −18.625=11101101.01100000 at operation 400. Since −18.625 is less than zero, the process moves to operation 415 where the input number is inverted to 00010010.10011111. From operation 415, the process moves to operation 420, where the leading zeros are counted. For this example, the leading zeros counted equals 3. From operation 420, the process moves to operation 425, where it is determined whether the input number is less than zero. Since the input number (00010010.10011111) is less than zero, at operation 445, the inverted input number is padded with ones to 00010010.1001111111111111111. From operation 445, the process moves to operation 450 where the result is shifted to the left by the number of zeros to 1.0010100111111111111111. From operation 450, the process moves to operation 455 where it is determined whether the fraction equals all ones. In this example, the fraction does not equal all ones, therefore the process moves to operation 465 where the sign bit is set to 1 and the exponent is computed and the fraction is incremented by 1 resulting in 1.0010101000000. From operation 465, the process moves to operation 470 where the floating point number is returned, for this example, the floating point number equals $-1*2^4*1.0010101=-16*1.1640625=-18.625$.

Figure 5:
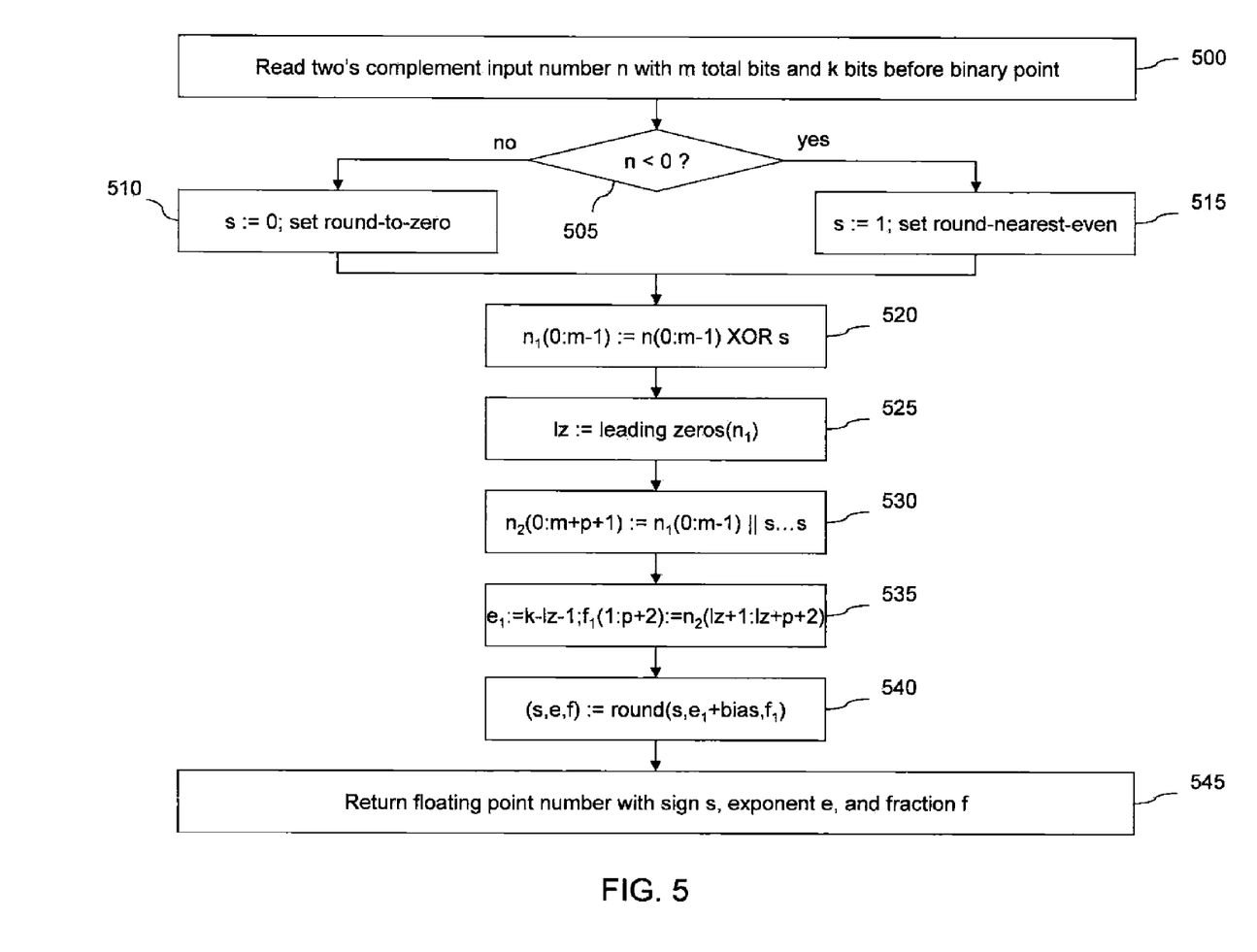
FIG. 5 is a flowchart illustrating the reuse of the rounder and normalizer to convert a fixed point number into a floating point number according to an embodiment of the present invention.

FIG. 5 is a flowchart illustrating the reuse of the rounder and normalizer to convert a signed fixed point number into a floating point number according to an embodiment of the present invention. In a preferred embodiment, the signed fixed point number is an estimate of a logarithm of an input floating point number. FIG. 5 illustrates the functionality of the normalizer 330 and the rounder 335 shown in FIG. 3, for example.

At operation 500, the two's complement input number n is read. From operation 500, the process moves to operation 505 where it is determined whether the input number n is less than zero or greater than or equal to zero. If it is determined in operation 505 that the input number n is greater than or equal to zero, the process moves to operation 510 where the signed bit is set to zero and the rounding mode is set to round-to-zero according to the IEEE 754 standard for floating point numbers. If it is determined in operation 505, that the input number n is less than zero, the process moves to operation 515 where the signed bit is set to one and the rounding mode is set to round-nearest-even according to the IEEE 754 standard. The standard rounding mode is well known in the art. According to an embodiment of the present invention, operations 500 through 515 are performed via the table lookup 314 (depicted in FIG. 3).

From operations 510 and 515, the process moves to operation 520, where the signed fixed point number ("n") is logically exclusively-ORed with the sign bit giving a first intermediate result. From operation 520, the process moves to operation 525 where the leading zeros (lz) of the first intermediate result is computed. Operations 520 and 525 are also performed via the table lookup 314. Thus, as mentioned above, the setting of the sign bit, the exclusive-ORing of the input number, the computing of the leading zeros and the padding of ones or zeros are performed as a part of a table lookup for the logarithm estimate.

From operation 525, the process moves to operation 530, where the first intermediate result is padded with ones or zeros on a least significant bit side based upon the sign bit. Then in operation 535, a second intermediate result is computed by shifting the padded first intermediate result to the left by a number based on the number of leading zeros. According to one embodiment, the operations 530 and 535 are performed via the normalizer 330 within the floating-point fused multiply-add computation, for example. The normalizer 330 is configured to perform a desired function by setting the normalizer 330 to a default normalization function as used in a computation of a fused multiply-add instruction. Further shown in FIG. 5, "p" represents the number of fraction bits and "bias" denotes the exponent bias of the precision of the floating point number.

From operation 535, the process moves to operation 540, where the sign bit s, the exponent e, and the fraction f are calculated by rounding the result of the normalizer 330, via the rounder 335 in the floating-point fused multiply-add computation. The rounder 335 is configured to performed a desired function by setting the rounder 335 to a default rounding function as used in the computation of a fused multiply-add instruction and applying an appropriate rounding mode. Further, according to an embodiment of the present invention, the exponent e is computed using the number of leading zeros and the fraction f is computed using the second intermediate result. From operation 540, the process moves to operation 545 where the floating point number is returned including the sign bit s, the exponent e, and the fraction f calculated.

According to one embodiment of the present invention, the method of converting from a fixed point to a floating point format is used for the log2 estimate instruction in the FPU. However, the present invention is not limited hereto, and may vary as necessary.

Embodiments of the present invention reuse the normalizer and the rounder. Therefore, it is possible to implement the log instruction in a fully pipelined way with the same latency as a FMA instruction. In addition, the present invention also eliminates the need for extra hardware in the pipeline, to manage the additional loop through the pipeline.

For the sake of description, FIGS. 4 and 5 assume that the number of leading zeros (lz) computed in steps 420 and 525 is exact. However, a state-of-the-art rounder supports a number of leading zeros that is off by one. Such a rounder determines whether the number of leading zeros is either correct or off by one based on the most significant bit of the second intermediate result. It corrects the second intermediate result and the number of leading zeros prior to the computing of the exponent e and the fraction f, i.e., directly after the steps 435, 450, and 535. The correction of the second intermediate result includes adding or subtracting one to or from the number of leading zeros and shifting the second intermediate result by one.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for converting a signed fixed point number into a floating point number in a floating-point unit of a processor, the floating-point unit comprising a preparation circuit, a normalizer, and a rounder, the method comprising:
    reading, by the preparation circuit, an input number that is a signed fixed point number to be converted into a floating point number, wherein the signed fixed point number is an estimate of a logarithm of an input floating point number;
    determining, by the preparation circuit, whether the input number is less than zero;
    setting, by the preparation circuit, a sign bit based upon whether the input number is less than zero or greater than or equal to zero;
    computing, by the preparation circuit, a first intermediate result by exclusive-ORing the input number with the sign bit;
    computing, by the preparation circuit, a number of leading zeros of the first intermediate result;
    padding, by the normalizer, the first intermediate result on a least significant bit side with ones or zeros based upon the sign bit;
    computing, by the normalizer, a second intermediate result by shifting the padded first intermediate result to the left by a number based on the number of leading zeros, wherein the computing of the second intermediate result based on the first intermediate result, the sign bit, and the number of leading zeros is performed within a normalization step of a floating-point fused multiply-add computation, wherein the normalization step is configured to perform a desired function by setting the normalization step to a default normalization function as used in a computation of a fused multiply-add instruction;
    computing, by the rounder, an exponent portion using the number of leading zeros;
    computing, by the rounder, a fraction portion using the second intermediate result;
    conditionally incrementing, by the rounder, the fraction portion based on the sign bit;
    correcting, by the rounder, the exponent portion and the fraction portion if the incremented fraction portion overflows; and
    returning the floating point number including the sign bit, and the exponent portion and fraction portion, wherein a computation of the floating point number based on the sign bit, the second intermediate result and the number of leading zeros is performed within a rounding step of the floating-point fused multiply-add computation, wherein the rounding step is configured to perform a desired function by setting the rounder to a default rounding function as used in the computation of a fused multiply-add instruction and applying an appropriate rounding mode, wherein the rounding mode is set based on the input number, and further wherein the setting of the sign bit, the exclusive-ORing of the input number, and the computing of the number of leading zeros are performed as part of a table lookup for the estimate of a logarithm of an input floating point number.

2. The method of claim 1, wherein setting the sign bit comprises:
    setting the sign bit to zero when it is determined that the input number is greater than or equal to zero; and
    setting the sign bit to one when it is determined that the input number is less than zero.

3. The method of claim 2, wherein padding the first intermediate result comprises:
    padding the first intermediate result with zeros when the sign bit is zero; and
    padding the first intermediate result with ones when the sign bit is one.

4. The method of claim 3, wherein the fraction portion is incremented if the sign bit is one and not incremented if the sign bit is zero; and
    wherein the exponent portion and the fraction portion are corrected if the fraction portion prior to incrementing includes all ones and the sign bit is one; and
    wherein the correcting of the exponent portion and the fraction portion comprises incrementing the exponent portion and setting the fraction portion to all zeros.

5. The method of claim 4, wherein the number of leading zeros is either a correct number of leading zeros of the first intermediate result or off by one; and
    wherein, if the number of leading zeros is off by one, the second intermediate result and the number of leading zeros are corrected prior to the computing of the exponent portion and the fraction portion based on a most significant bit of the second intermediate result; and
    wherein the correction of the number of leading zeros and the second intermediate result comprises adding or subtracting one to or from the number of leading zeros and shifting the second intermediate result by one.

6. The method of claim 1, further comprising:
    setting the rounding mode to round-to-zero as the appropriate rounding mode based on determining that the input number is greater than or equal to zero; and
    setting the rounding mode to round-nearest-even as the appropriate rounding mode based on determining that the input number is less than zero.

7. A computer program product comprising a non-transitory useable medium including a computer readable program, wherein the computer readable program when executed on a computer causes the computer to implement a method for converting a signed fixed point number into a floating point number, the method comprising:

reading an input number that is a signed fixed point number to be converted into a floating point number, wherein the signed fixed point number is an estimate of a logarithm of an input floating point number;
determining whether the input number is less than zero;
setting a sign bit based upon whether the input number is less than zero or greater than or equal to zero;
computing a first intermediate result by exclusive-ORing the input number with the sign bit;
computing a number of leading zeros of the first intermediate result;
padding the first intermediate result on a least significant bit side with ones or zeros based upon the sign bit;
computing a second intermediate result by shifting the padded first intermediate result to the left by a number based on the number of leading zeros, wherein the computing of the second intermediate result based on the first intermediate result, the sign bit, and the number of leading zeros is performed within a normalization step of a floating-point fused multiply-add computation, wherein the normalization step is configured to perform a desired function by setting the normalization step to a default normalization function as used in a computation of a fused multiply-add instruction;
computing an exponent portion using the number of leading zeros;
computing a fraction portion using the second intermediate result;
conditionally incrementing the fraction portion based on the sign bit;
correcting the exponent portion and the fraction portion if the incremented fraction portion overflows; and
returning, the floating point number including the sign bit, and the exponent portion and fraction portion, wherein a computation of the floating point number based on the sign bit, the second intermediate result and the number of leading zeros is performed within a rounding step of the floating-point fused multiply-add computation, wherein the rounding step is configured to perform a desired function by setting the rounder to a default rounding function as used in the computation of a fused multiply-add instruction and applying an appropriate rounding mode, wherein the rounding mode is set based on the input number, and further wherein the setting of the sign bit, the exclusive-ORing of the input number, and the computing of the number of leading zeros are performed as part of a table lookup for the estimate of a logarithm of an input floating point number.

8. The computer program product of claim 7, wherein setting the sign bit comprises:
setting the sign bit to zero when it is determined that the input number is greater than or equal to zero; and
setting the sign bit to one when it is determined that the input number is less than zero.

9. The computer program product of claim 8, wherein padding the first intermediate result comprises:
padding the first intermediate result with zeros when the sign bit is zero; and
padding the first intermediate result with ones when the sign bit is one.

10. The computer program product of claim 9, wherein the fraction portion is incremented if the sign bit is one and not incremented if the sign bit is zero; and
wherein the exponent portion and the fraction portion are corrected if the fraction portion prior to incrementing includes all ones and the sign bit is one; and
wherein the correcting of the exponent portion and the fraction portion comprises incrementing the exponent portion and setting the fraction portion to all zeros.

11. The computer program product of claim 10, wherein the number of leading zeros is either a correct number of leading zeros of the first intermediate result or off by one; and
wherein, if the number of leading zeros is off by one, the second intermediate result and the number of leading zeros are corrected prior to the computing of the exponent portion and the fraction portion based on a most significant bit of the second intermediate result; and
wherein the correction of the number of leading zeros and the second intermediate result comprises adding or subtracting one to or from the number of leading zeros and shifting the second intermediate result by one.

12. The computer program product of claim 7, further comprising:
setting the rounding mode to round-to-zero as the appropriate rounding mode based on determining that the input number is greater than or equal to zero; and
setting the rounding mode to round-nearest-even as the appropriate rounding mode based on determining that the input number is less than zero.

13. A system for converting a signed fixed point number into a floating point number within a floating point unit of a processor, the system comprising:
a preparation circuit reading an input number that is a signed fixed point number to be converted into a floating point number, wherein the signed fixed point number is an estimate of a logarithm of an input floating point number, the preparation circuit comprising a circuit to determine whether the input number is less than zero and to set a sign bit based upon whether the input number is less than zero or greater than or equal to zero, to compute a first intermediate result from the input number by exclusive-ORing the input number with the sign bit, and to compute a number of leading zeros of the first intermediate result, wherein the setting of the sign bit the exclusive-ORing of the input number, and the computing of the number of leading zeros are performed as part of a table lookup for the estimate of a logarithm of an input floating point number;
a normalizer configured to pad the first intermediate result on a least significant bit side with ones or zeros based on the sign bit and to compute a second intermediate result by shifting the padded first intermediate result to the left by the number of leading zeros computed, wherein the normalizer is configured to perform a desired function by setting the normalizer to a default normalization function as used in a computation of a fused multiply-add instruction; and
a rounder configured to compute an exponent portion using the number of leading zeros, to compute a fraction portion using the second intermediate result, and to conditionally increment the fraction portion based on the sign bit and to return a floating point number including the sign bit, the exponent portion and the fraction portion, wherein the normalizer and rounder are part of a floating point unit able to execute fused-multiply-add operations, and wherein the rounder is configured to perform a desired function by setting the rounder to a default rounding function as used in the computation of a fused multiply-add instruction and applying an appropriate rounding mode, wherein the rounding mode is set based on the input number.

14. The system of claim 13, wherein the sign bit is set to zero when it is determined that the input number is greater than or equal to zero and the sign bit is set to one when it is determined that the input number is less than zero; and wherein the first intermediate result is padded with zeros when the sign bit is zero and padded with ones when the sign bit is one.

15. The system of claim 14, wherein the fraction portion is incremented if the sign bit is one and not incremented if the sign bit is zero; and wherein the exponent portion and the fraction portion are corrected if the fraction portion prior to incrementing includes all ones and the sign bit is one; and wherein the correcting of the exponent portion and the fraction portion comprises incrementing the exponent portion and setting the fraction portion to all zeros.

16. The system of claim 15, wherein the number of leading zeros is either a correct number of leading zeros of the first intermediate result or off by one; and wherein, if the number of leading zeros is off by one, the rounder corrects the second intermediate result and the number of leading zeros prior to the computing of the exponent portion and the fraction portion based on a most significant bit of the second intermediate result; and wherein the correction of the number of leading zeros and the second intermediate result comprises adding or subtracting one to or from the number of leading zeros and shifting the second intermediate result by one.

17. The system of claim 13, wherein the rounding mode is set to round-to-zero as the appropriate rounding mode based on the determination that the input number is greater than or equal to zero, and the rounding mode is set to round-nearest-even as the appropriate rounding mode based on the determination that the input number is less than zero.

* * * * *